United States Patent
Silver et al.

(10) Patent No.: US 7,053,662 B1
(45) Date of Patent: May 30, 2006

(54) METHOD AND CIRCUIT FOR HIGH SPEED TRANSMISSION GATE LOGIC

(75) Inventors: John Silver, Monument, CO (US); Bogdan Georgescu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 116 days.

(21) Appl. No.: 10/778,504

(22) Filed: Feb. 13, 2004

Related U.S. Application Data (60) Provisional application No. 60/450,388, filed on Feb. 26, 2003.

(51) Int. Cl.
*H03K 19/20* (2006.01)

(52) U.S. Cl. ..................... 326/113; 326/119

(58) Field of Classification Search .................. 326/113
See application file for complete search history.

(56) References Cited

U.S. PATENT DOCUMENTS

| | | | | |
|---|---|---|---|---|
| 5,644,265 A | * | 7/1997 | Austin et al. | 327/333 |
| 5,701,094 A | | 12/1997 | Sridhar et al. | |
| 6,031,393 A | * | 2/2000 | Wayner | 326/81 |
| 6,232,797 B1 | * | 5/2001 | Choi et al. | 326/93 |
| 6,650,167 B1 | * | 11/2003 | Benzer et al. | 327/333 |

* cited by examiner

*Primary Examiner*—James H. Cho
(74) *Attorney, Agent, or Firm*—Bradley T. Sako (57) ABSTRACT

A transmission gate logic circuit (200) can include a supply path (206) connected to an output of a passgate (202). A boost path (208) can be situated between an input of passgate (202) and the supply path (206) and can enable a first supply device (206-0) within the supply path (206) in response to a signal C at the input of passgate (202). A supply path (208) can thus provide a boost at the output node (214) of passgate (202) resulting in faster logic transition times.

19 Claims, 5 Drawing Sheets

| A | B | C | X | |
|---|---|---|---|---|
| L | x | x | H | L = logic low |
| x | L | x | H | H = logic high |
| x | x | L | H | x = don't care |
| H | H | H | L | |

| A | B | C | Y |
|---|---|---|---|
| H | x | x | L |
| x | H | x | L |
| x | x | H | L |
| L | L | L | H |

L = logic low
H = logic high
x = don't care

METHOD AND CIRCUIT FOR HIGH SPEED TRANSMISSION GATE LOGIC

This application claims the benefit of Provisional Application No. 60/450,388, filed Feb. 26, 2003.

TECHNICAL FIELD

The present invention relates generally to transmission gate circuits, and more particularly to transmission gate logic circuits that selectively transmits a signal with low propagation delay.

BACKGROUND OF THE INVENTION

Conventional complementary-metal-oxide-semiconductor (CMOS) logic gates, such as NAND-gates, NOR-gates, and inverters, are typically used in applications where the speed of the signal transmission through a particular gate is not necessarily critical.

For speed critical paths, an alternate approach to conventional CMOS logic gates can be transmission gate logic circuits. A typical conventional transmission gate logic circuit includes an NMOS (i.e., n-channel) transistor and a PMOS (i.e., p-channel) transistor configured with source/drain regions connected together to form a CMOS transmission gate (i.e., passgate). The propagation of a "primary" signal through the passgate can be controlled according to other logic signals, thus establishing a desired response.

Transmission gate logic circuits can offer a distinct speed advantage over corresponding conventional CMOS logic gates. Transmission gate logic circuits can be used to implement basic logical functions, but with a critical signal path optimized for signal propagation. This can be realized by reducing the levels or number of stages of logic gates required to achieve the same logic function with similar or better circuit input/output capabilities.

A CMOS transmission gate equivalent can also eliminate buffering in some applications by isolating an input from a large driving inverter using a passgate gate. This capability makes the transmission gate logic approach suitable for certain decoding signals, such as address decode signals in a memory device. In such applications, lower input capacitance seen at each local decoder circuit can reduces the overall capacitance of the select line, and hence the overall delay of the decode logic is reduced.

Despite the speed advantages of transmission gate logic implementations, there are limitations with such conventional approaches. To better understand features of the various embodiments of the present invention, conventional transmission logic gate arrangements will first be described.

Figure 7A:
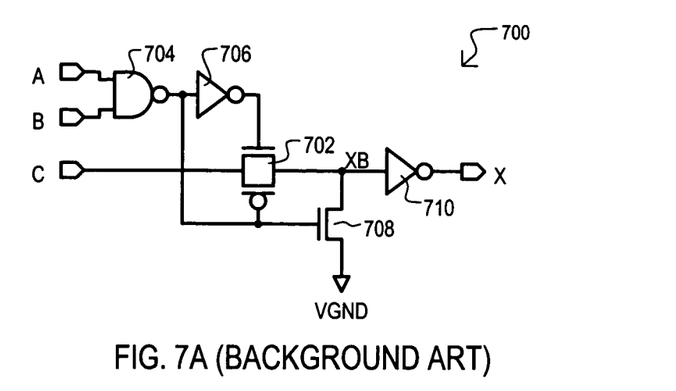
FIG. 7A is a schematic diagram of a conventional transmission gate logic circuit.
Figure 7B:
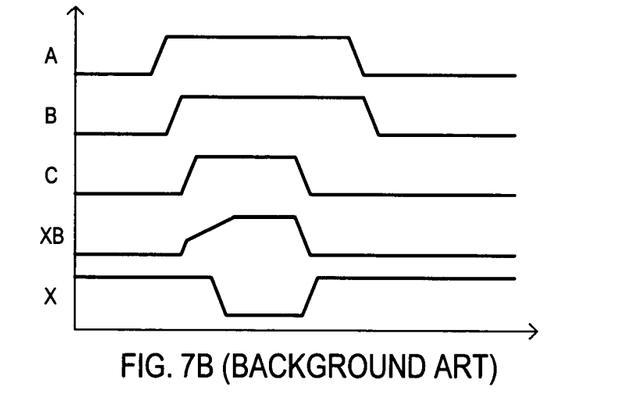
FIG. 7B is a timing diagram showing the operation of circuit shown in FIG. 7A.

FIG. 7A shows a schematic diagram of a conventional transmission gate NAND logic circuit. FIG. 7B is a timing diagram showing the operation of the circuit set forth in FIG. 7A. The conventional circuit of FIG. 7A is designated by the general reference character 700 and includes a passgate gate 702, NAND logic gate 704, an inverter 706, a setting device 708, and a buffer inverter 710.

Logic gate 704 can receive input signals A and B. When input signals A and B transition high, logic gate 704 provides a low output, which enables passgate gate 702. That is, the output of logic gate 704 can enable the p-channel portion of passgate 702, while the output of inverter 706 can enable an n-channel portion of passgate 702. In this way, when signals A and B are both high, a "primary" input signal C can propagate through transmission gate 702 to node XB. When signal A or B or both A and B are low, passgate 702 is turned off, and node XB is set to default low value by operation of setting device 708.

A logic value at node XB can be inverted (e.g., buffered) by buffer inverter 710 to provide output signal X.

A drawback to the conventional arrangement of FIG. 7A can be that a resulting slew rate of a signal at node XB is tied to that of primary input signal C. Consequently, assuming the signals A and B are both high prior to a change in the signal at node C, if a slew rate for signal C is undesirably slow, a resulting response at node XB will likewise be even slower.

Another drawback to the conventional arrangement set forth in FIG. 7A can be the effectiveness of the n-channel device within passgate 702. In particular, as operating voltages are lowered, the impedance presented by such an n-channel device is limited by its threshold voltage (Vtn). That is, when an input signal at node C transitions from low to high, once the potential at node XB is greater than VPWR-Vtn, signal transmission is provided solely by the p-channel device of transmission gate 702, as the n-channel device will be turned off due to its gate-source voltage that becomes equal or smaller than the threshold voltage. Such an effect is illustrated by FIG. 7B.

FIG. 7B is a timing diagram showing input signals A, B, and C, as well as node XB and output X.

Figure 7C:
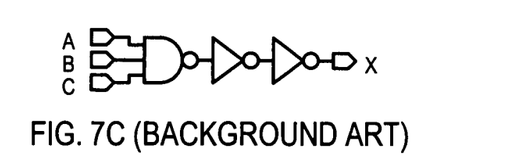
FIG. 7C is a logic gate equivalent for the circuit set forth in FIG. 7A.
Figure 7D:
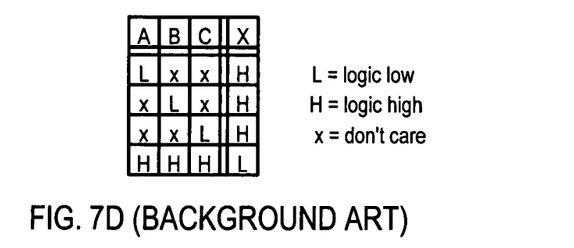
FIG. 7D is a truth table showing the response of the circuit shown in FIG. 7A.

An equivalent logic circuit representation for the conventional circuit of FIG. 7A is shown in FIG. 7C. Also, a truth table result for the circuit of FIG. 7A is shown in FIG. 7D.

Figure 8A:
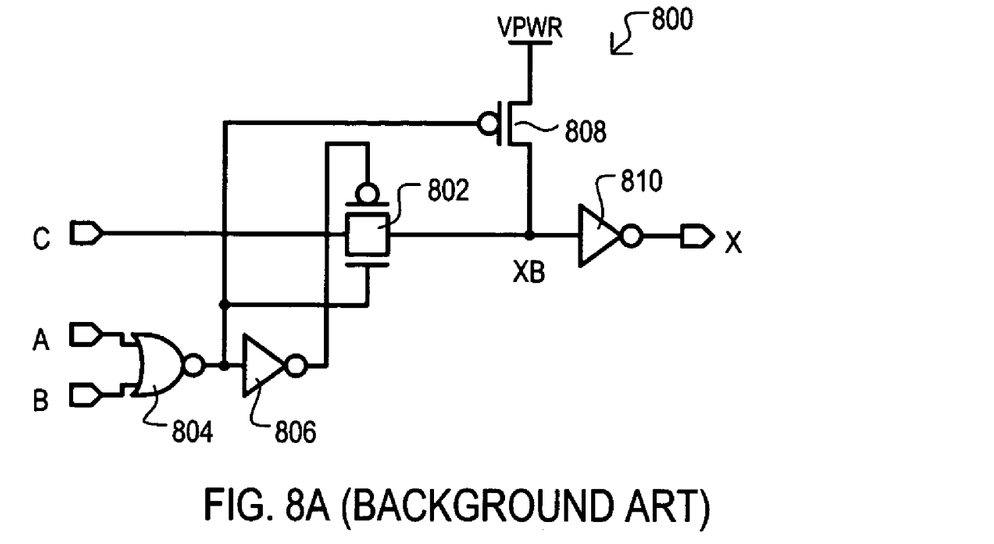
FIG. 8A is a schematic diagram of a second conventional transmission gate logic circuit.
Figure 8B:
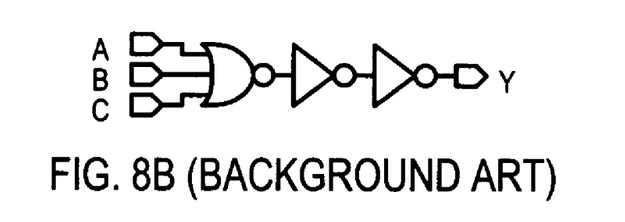
FIG. 8B is a logic gate equivalent for the circuit set forth in FIG. 8A.
Figure 8C:
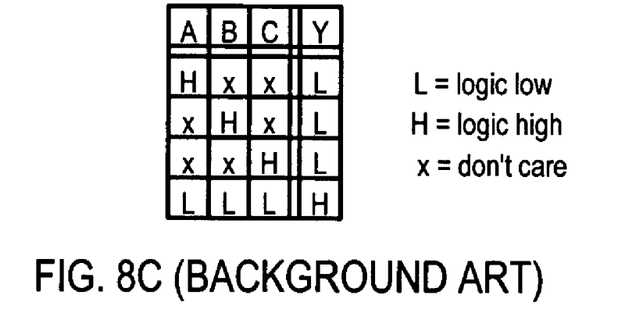
FIG. 8C is a truth table showing the response of the circuit shown in FIG. 8A.

A second conventional example of a transmission gate logic circuit is shown in FIGS. 8A to 8C, and sets forth an example of a NOR gate. FIG. 8A is a schematic diagram and shows the same general components as FIG. 7A, with like sections being identified by the same reference character but with a first digit being a "8" instead of a "7". As shown in FIG. 8A, unlike FIG. 7A, in circuit 800 logic gate 804 is a NOR gate, and transistor 808 is a pull up transistor.

FIG. 8B shows an equivalent logic circuit representation for the conventional circuit of FIG. 8A. FIG. 8C shows a truth table result for the circuit of FIG. 8A which shows the NOR logic function.

As noted briefly above, one application for high speed logic circuits can be in decoder circuits for memory devices and the like. More particularly, very high speed memory devices, such as quad data rate (QDR) random access memories (RAMs), can benefit from faster decoding operations, as such results can allow for faster selection of a memory array portion (e.g., quadrant, section, block, row group, row, column group, column), and hence faster reading and/or writing of data values.

In light of the above, it would be desirable to arrive at some way of providing high speed transmission gate logic that does not suffer from the drawbacks of conventional approaches, like that shown in FIGS. 7A to 8C.

SUMMARY OF THE INVENTION

The present invention can include a transmission gate logic circuit having a passgate circuit and a supply path coupled between a supply node and the output of the passgate circuit. The transmission logic gate circuit also includes a boost path coupled between the input of the passgate and the supply path. This enables at least a portion of the supply path when an input signal at the input of the passgate circuit makes a predetermined transition.

In such an arrangement, by enabling the supply path according to the boost path, a gain effect can be provided that can allow the output of the passgate circuit to transition at a faster rate than the slew rate of an input signal.

According to another aspect of the embodiments, the passgate circuit can include transistors of complementary conductivity having source drain paths arranged in parallel with one another.

In such an arrangement, a boost path and supply path can counteract reductions in conductivity of one the passgate devices arising from the threshold voltage of the device.

According to another aspect of the embodiments, the supply path can be a pull-up path (e.g., in the case of NAND circuit) or a pull-down path (e.g., in the case of a NOR circuit).

According to another aspect of the embodiments, a supply path can include two transistors: a boosting transistor having a gate coupled to the boost path and an enable transistor having a gate that receives an enable control signal.

According to another aspect of the embodiments, the transmission gate logic circuit can include a logic gate having at least two inputs different than the passgate input. The output of the logic gate can provide an enable signal for the supply path.

Such an arrangement can ensure that the supply path is disabled when the passgate circuit is disabled.

According to another aspect of the embodiments, the boost path can include an inverter configured to have a switching point different than a potential midway between the high logic level and the low logic level. The switching point can be less than the midway point or greater than the midway point.

Such an arrangement can increase the speed at which the supply path is enabled. Thus, the gain effect can occur as, or prior to, the point at which one of the passgate transistors goes into high impedance due to its threshold voltage. According to another aspect of the embodiments, such an inverter can include complementary conductivity transistors having a gate width ratio of greater than 7:1.

According to another aspect of the embodiments, a transmission logic gate circuit can further include a logic gate having at least two inputs different than the passgate input and a gate output coupled to the supply path an enable input of the passgate. Such a logic circuit can be a NAND gate or NOR gate, for example.

The present invention can also include a method of reducing propagation delay through a transmission gate logic circuit. Such a method can include enabling a supply path coupled to an output of a passgate in advance of the activation of a primary signal at the input of the passgate. The method may also include boosting a signal strength at the output of the passgate by allowing charge to flow through the supply path.

By boosting a signal strength in such a manner, logic transition speeds for the primary signal can be increased, improving the performance of the transmission gate logic circuit.

According to one aspect of the embodiments, enabling the supply path can include enabling a pull-up path coupled between the output of the passgate and a high power supply voltage. Further, activation of the primary signal includes the primary signal transitioning from a low logic level to a high logic level while the passgate is enabled. Conversely, enabling the supply path can include enabling a pull-down path coupled between the output of the passgate and a low power supply voltage, and activation of the primary signal includes the primary signal transitioning from a high logic level to a low logic level while the passgate is enabled.

According to another aspect of the embodiments, such a method may also include enabling the passgate according to at least two input signals that are different than the primary input signal.

The present invention may also include a transmission gate logic circuit that includes a passgate coupled between a primary signal input and a passgate output. The passgate is enabled according to logic values of at least two other input signals that are different than the primary signal. A supply path can be coupled between the passgate output and a first predetermined potential. Further, a boost path can be coupled between the primary signal input and the supply path. The boost path can enable at least a first portion of the supply path in response to a predetermined transition in the primary signal.

According to one aspect of the embodiments, a passgate comprises at least one n-channel transistor and the supply path includes at least one p-channel transistor having a source-drain path coupled between a high power supply voltage and the passgate output. The boost path can include an inverter with an n-channel transistor having a drive strength greater than the p-channel transistor according to a ratio that is greater than 7:1.

According to another aspect of the embodiments, the transmission gate logic circuit can also include a logic circuit having inputs that receive the two other input signals. At least a second portion of the supply path and the passgate can be enabled in response to the logic circuit output having a first value.

According to another aspect of the embodiments, the transmission gate logic circuit can further include a logic setting device coupled between the passgate output and a second predetermined potential that provides a current path when the logic circuit output has a second value.

According to another aspect of the embodiments, the transmission gate logic circuit further includes an enable path coupled between the logic circuit output and the supply path that enables at least a second portion of the supply path in response to a predetermined output of the logic circuit.

DETAILED DESCRIPTION

Various embodiments of the present invention will now be described in detail with reference to a number of drawings. The embodiments include transmission gate logic circuits that boost the output potential of a passgate according to a signal at the input of the passgate. Such a boosting can occur at the point at which the drive of a passgate gate device falls off due to its inherent threshold voltage. In addition, or alternatively, such a boosting can result in the output of the passgate transitioning at a faster speed than the slew rate of the input signal.

Figure 1:
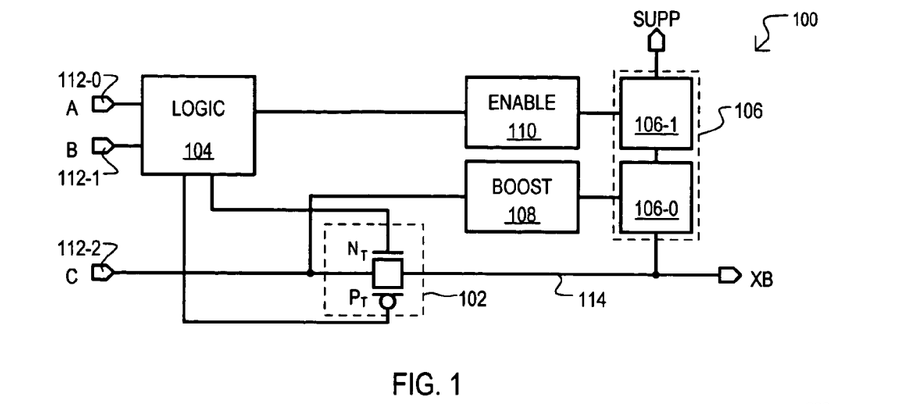
FIG. 1 is a block schematic diagram of a first embodiment of the present invention.

Referring now to FIG. 1, a first embodiment of the present invention is a transmission gate logic circuit is set forth in a block schematic diagram, and designated by the general reference character 100. A transmission gate logic circuit 100 may include a passgate 102, a logic circuit 104, a supply path 106, a boost path 108, and an enable path 110.

In the particular example of FIG. 1, transmission gate logic circuit 100 is a three input logic circuit, and receives an input signal A at first input 112-0, an input signal B at second input 112-1, and an input signal C at a third input 112-2. An output signal X can be provided at output node 114. Input signal C can be considered a "primary" input signal, as it is the signal that is selectively passed through passgate 102.

A passgate 102 can be a complementary metal oxide semiconductor (CMOS) passgate that includes an n-channel field effect transistor (FET) $N_T$ arranged in parallel with a p-channel FET $P_T$. Passgate 102 can be enabled according to outputs from logic circuit 104. When enabled, passgate 102 can allow signal C to propagate from third input 112-2 to output node 114. Because passgate 102 includes FET devices, the passgate 102 can have the limitations noted above arising from inherent threshold voltages (Vts) of the devices.

More particularly, assuming passgate 102 is enabled by outputs from logic circuit 104, as signal C transitions from a low logic level $V_L$ to a high level $V_H$, the drive (e.g., conductivity) of transistor $N_T$ will fall off as the signal C rises past $V_H-V_{tn}$ to $V_H$ (where Vtn is the threshold voltage of transistor $N_T$). Consequently, essentially all drive for passgate 102 in this voltage region ($>V_H-V_{tn}$) is provided by the p-channel FET $P_T$ at these levels. Likewise, as signal C transitions from a high logic level $V_H$ to a low level $V_L$, the drive of transistor $P_T$ will fall off as the signal C falls from $V_L+V_{tP}$ to $V_L$ (where Vtp is the threshold voltage of transistor $P_T$).

A logic gate 104 can receive signals A and B at first and second inputs (112-0 and 112-1), and in response to the logic values of such signals, enable or disable passgate 102. In addition, in the arrangement of FIG. 1, an output from logic gate 104 can enable supply path 106 by way of enable path 110.

A supply path 106 can provide a path to a supply potential SUPP. In FIG. 1, a supply path 106 includes first supply device 106-0 enabled according to boost path 108, and second supply device 106-1 enabled according to enable path 110. When enabled, supply path 106 can drive output node 114 toward supply potential SUPP.

A boost path 108 essentially feeds signal C forward to first supply device 106-0. Thus, when signal C reaches a certain potential, a boost path 108 can enable first supply device 106-0, and thus introduce a gain into the response of the circuit with respect to signal C. As will be described in more detail below, a boost path 108 may preferably provide a rapid transition in state when one of the transistors ($P_T$ or $N_T$) is in the low/no gain range.

An enable path 110 can enable second supply device 106-1 according to an output from a logic circuit 104.

The general operation of the first embodiment 100 will now be described. When signals A and B reach predetermined values, passgate 102 can be enabled. With passgate 102 enabled, primary signal C may make a transition. This transition in signal C will propagate to output node 114, as in a conventional passgate logic circuit such as that shown in FIGS. 7A and 8A.

However, unlike a conventional case, boost path 108 can feed such a logic value forward, and for a predetermined transition (e.g., low-to-high or high-to-low), enable first supply device 106-0, and thus drive output node 114 faster in the direction of the logic transition (assuming second supply device 106-1 is already enabled). In this way, the supply path 106 can be enabled in advance of a full activation of primary input signal C.

Having described a first embodiment, various other embodiments will now be described.

Figure 2A:
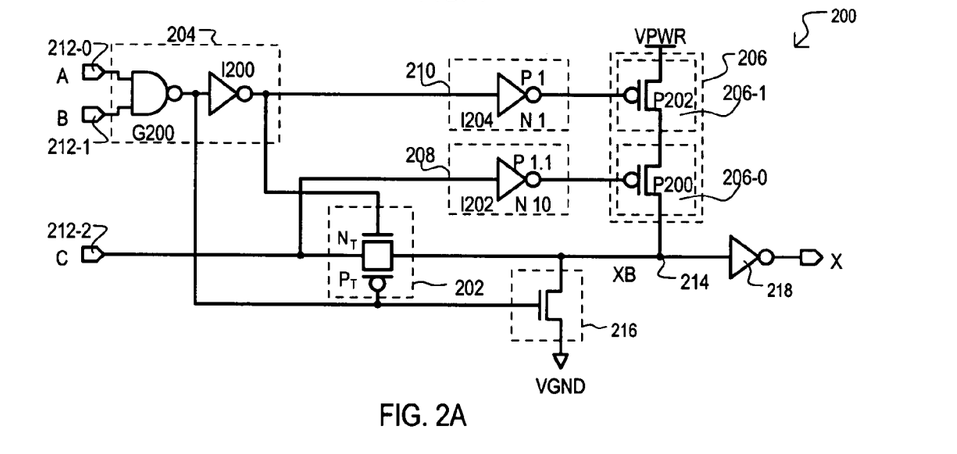
FIG. 2A is a schematic diagram of a second embodiment of the present invention.
Figure 2B:
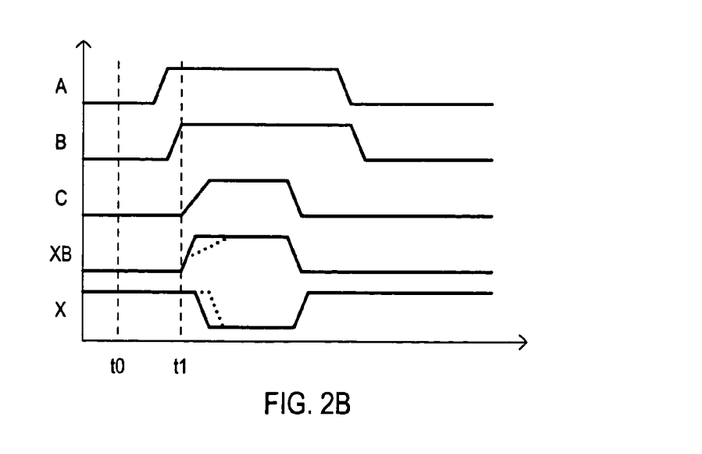
FIG. 2B is a timing diagram showing the operation of the second embodiment—solid lines vs. conventional transmission gate—dashed lines.

A second embodiment is shown in FIGS. 2A and 2B. FIG. 2A is a schematic diagram of the second embodiment. FIG. 2B is a timing diagram showing the operation of the second embodiment. The particular example of FIGS. 2A and 2B shows one implementation of a transmission gate NAND logic.

A second embodiment can include some of the same general constituents as the first embodiment. Accordingly, like sections will be referred to by the same reference character but with the first digit being a "2" instead of a "1". Unlike FIG. 1, the circuit of FIG. 2A also includes a setting device 216 and a buffer inverter 218.

Thus, as shown in FIG. 2A, a logic circuit 204 can include a NAND gate G200 in series with an inverter I200. The output of NAND gate G200 can enable/disable transistor $P_T$ of passgate 204, as well as enable/disable setting device 216. The output of inverter I200 can enable/disable transistor $N_T$ of passgate 204, and can be provided to enable path 210.

Within a supply path 206, a first supply device 206-0 can include a p-channel transistor P200 while a second supply device 206-1 can include a p-channel transistor P202. Source-drain paths of transistors P200 and P202 can be arranged in series between output node 214 and high power supply voltage VPWR.

Boost path 208 can include an inverter I202 having an input coupled to third input 212-2 and an output coupled to the gate of transistor P200. An inverter I202 may be sized to provide a lower threshold point (point at which an input signal forces a transition in the output signal) than a conventionally sized inverter (e.g., size to switch at a midway point between VPWR and VGND).

In the very particular example of FIG. 2A, an inverter can be a CMOS inverter composed of an n-channel transistor and p-channel transistor. The gate width of the n-channel transistor can be greater than that of the p-channel transistor, at a ratio of greater than 5:1, preferably greater than 7:1, even more preferably about 10:1.1. Such an arrangement can result in inverter I202 having a lower threshold voltage $V_{TINV}$. Thus, once input signal C rises greater than a threshold voltage $V_{TINV}$, the output of inverter I202 will transition low. It is understood that $V_{TINV}<\frac{1}{2}$ (VPWR-VGND).

Enable path 210 can include an inverter I204, and can enable second supply device 206-1 according to predetermined combinations of input signals A and B. In this particular case, inverter I204 provides a low output only when signals A and B are both high.

Setting device 216 can drive output node 214 to a predetermined value in response to combinations of input signals A and B. In this particular case, setting device 216 is an n-channel transistor that drives output node 214 low when either signal A or B is low.

Buffer inverter 218 can drive output signal X according to the potential at output node 214.

The operation of a second embodiment 200 will now be described with reference to FIG. 2B. When either signal A or B is low, the output of NAND gate G200 will be high and the output of inverter I200 will be low. Consequently, passgate 202 will be turned off, preventing signal C from propagating to output node 214. At the same time, setting device 216 will be turned on, pulling node 214 (signal XB) low a low supply value (VGND). Inverter buffer 218 inverts such a low XB signal to generate a high output signal X.

One example of such a state is shown in FIG. 2B, at time t0. At time t0, both signals A and B are low, thus output signal X is high.

Prior to time t1, both signals A and B can transition high, forcing the output of NAND gate G200 low and the output of inverter I200 high. Consequently, passgate 202 will be turned on, allowing signal C to propagate to output node 214. As noted above, absent some other effect, a slew rate of the signal at output node 214 will be limited by the slew rate of primary input signal C. Further, in a higher voltage range (VPWR-Vtn to VPWR) n-channel passgate device $N_T$ does not contribute any gain through passgate 202.

At the same time, setting device 216 will be turned off, isolating node 214 from VGND. Further, due to enable path 210, second supply device 206-1 will be enabled.

Shortly after time t1, signal C can begin to transition high. When signal C exceeds low inverter threshold voltage $V_{TINV}$, boost path 208 will turn on first supply device 206-0, providing a path between high power supply VPWR and output node 214. This can cause output node 214 to rise faster in potential than the slew rate of input signal C, and without regard to the high threshold voltage of passgate transistor $N_T$, thereby improving performance over conventional approaches. Looked at in another way, boost path 208 and supply path 206 can provide a gain effect at the output of passgate 214.

An improved response provided by a second embodiment is shown in FIG. 2B by comparing transition times of the solid XB and X waveforms (representing the second embodiment) with respect to the dotted waveforms, which represent the conventional approach of FIG. 7A.

Figure 3:
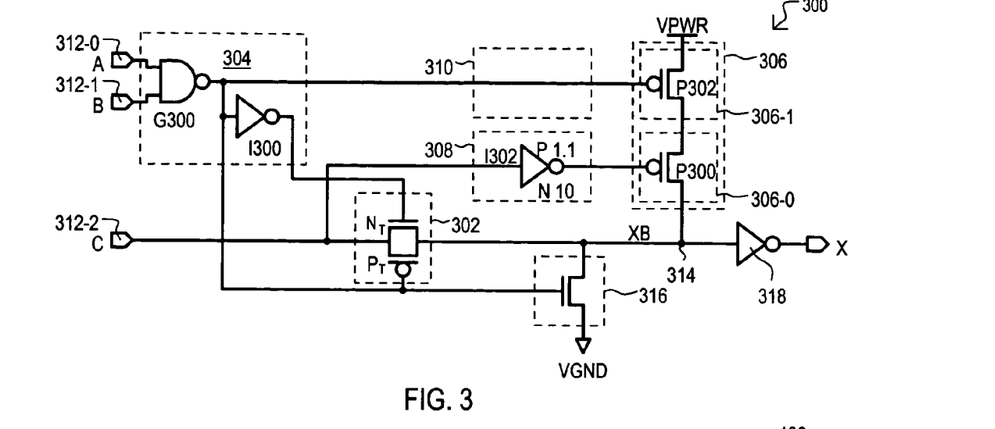
FIG. 3 is a schematic diagram of a third embodiment of the present invention.

A third embodiment of the present invention is set forth in FIG. 3 and designated by the general reference character 300. The embodiment of FIG. 3 represents a modification to the transmission NAND gate of FIG. 2A.

The third embodiment can include some of the same general constituents as the second embodiment. Accordingly, like sections will be referred to by the same reference character but with the first digit being a "3" instead of a "2".

FIG. 3 differs from FIG. 2 in that NAND gate G300 can drive second enable device 306-1 by way of enable path 310, which can provide a direct connection (as opposed to an inverter).

Otherwise, the operation of the third embodiment generally follows that of the second embodiment.

Of course, the present invention should not be limited to any particular logic gate configuration. As but two of the many possible variations, a fourth and fifth embodiment will be described.

Figure 4:
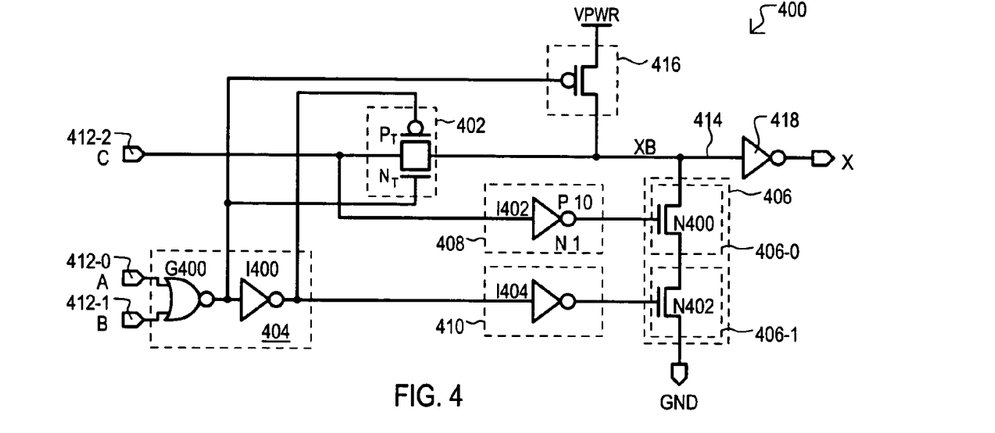
FIG. 4 is a schematic diagram of a fourth embodiment of the present invention

A fourth embodiment is shown in FIG. 4 and designated by the general reference character 400. The particular example of FIG. 4 shows one implementation of a transmission logic gate that provides a NOR function.

A fourth embodiment can include some of the same general constituents as the first embodiment. Accordingly, like sections will be referred to by the same reference character but with the first digit being a "4" instead of a "1". Like FIGS. 2A and 3, however, the circuit of FIG. 4 also includes a setting device 416 and a buffer inverter 418.

As shown in FIG. 4, a logic circuit 404 can include a NOR gate G400 in series with an inverter I400. The output of NAND gate G400 can enable/disable transistor $N_T$ of passgate 404, as well as enable/disable setting device 416. The output of inverter I400 can enable/disable transistor $P_T$ of passgate 404, and can be applied to enable path 410.

Supply path 406 can provide a path to a low power supply VGND. Thus, a first supply device 406-0 can include an n-channel transistor N400 while a second supply device 406-1 can include an n-channel transistor N402.

Boost path 408 can include inverter I402 situated between third input 412-2 and the gate of transistor N400. In similar fashion to the first and second embodiments, an inverter I402 may be sized to provide a threshold voltage other than a midway logic point. However, in the case of FIG. 4, inverter I402 can provide a higher threshold point. In the very particular example of FIG. 4, inverter I402 can be a CMOS inverter with the gate width of the p-channel transistor being greater than that of the n-channel transistor. Such a gate width ratio can be greater than 5:1, preferably greater than 7:1, or even greater. Thus, once primary input signal C falls lower than a threshold voltage $V_{TINV}$, the output of inverter I402 will transition high. It is understood that $V_{TINVH} > \frac{1}{2}$ (VPWR-VGND).

Enable path 410 can include an inverter I404, and can enable second supply device 406-1 when signals A and B are both low.

Setting device 416 can be a p-channel transistor that drives output node 414 high when either signal A or B is high.

Buffer inverter 418 can drive output signal X according to the potential at output node 414.

The operation of a fourth embodiment 400 will now be described. When either signal A or B is high, the output of NOR gate G400 will be low and the output of inverter I400 will be high. Consequently, passgate 402 will be turned off, preventing signal C from propagating to output node 414. At the same time, setting device 416 will be turned on, pulling node 414 (signal XB) to a high supply value (VPWR). Inverter buffer 418 inverts such a high XB signal to generate a low output signal X.

When both signals A and B are low, the output of NOR gate G400 can be forced high and the output of inverter I400 low. Consequently, passgate 402 will be turned on, allowing signal C to propagate to output node 414. As in the prior embodiments, absent some other effect, in a high-to-low transition of signal C, a slew rate of the signal at output node 414 will be limited by the slew rate of signal C and a resulting high threshold voltage of p-channel passgate device $P_T$, as the voltage falls below Vtp+VGND.

At the same time, setting device 416 will be turned off, isolating node 414 from VPWR. Further, due to enable path 410, second supply device 406-1 will be enabled.

When signal C falls below high inverter threshold voltage $V_{TINV}$, boost path 408 will turn on first supply device 406-0, providing a path between low power supply VGND and output node 414. This can cause output node 414 to fall faster in potential than the slew rate of input signal C, and without regard to the high threshold voltage of passgate transistor $P_T$, improving performance over conventional approaches. In this way, the embodiment may also provide a gain effect at output node 414 by way of boost path 408 and supply path 406.

Figure 5:
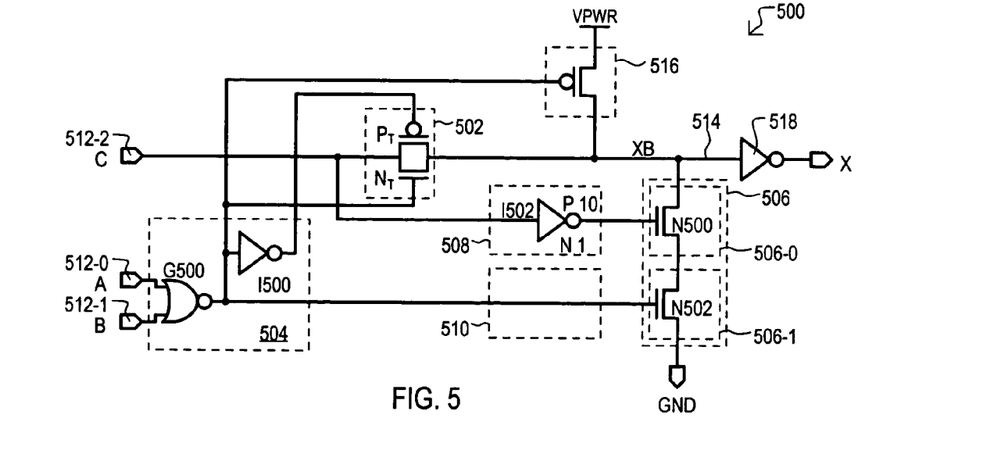
FIG. 5 is a schematic diagram of a fifth embodiment of the present invention

A fifth embodiment of the present invention is set forth in FIG. 5 and designated by the general reference character 500. The embodiment of FIG. 5 represents a modification to the transmission NOR gate of FIG. 4.

The fifth embodiment can include some of the same general constituents as the second embodiment. Accordingly, like sections will be referred to by the same reference character but with the first digit being a "5" instead of a "4".

FIG. 5 differs from FIG. 4 in that NOR gate G500 can drive second enable device 506-1 by way of enable path 510, which can provide a direct connection thereto.

Otherwise, the operation of the fifth embodiment generally follows that of the fourth embodiment.

Figure 6:
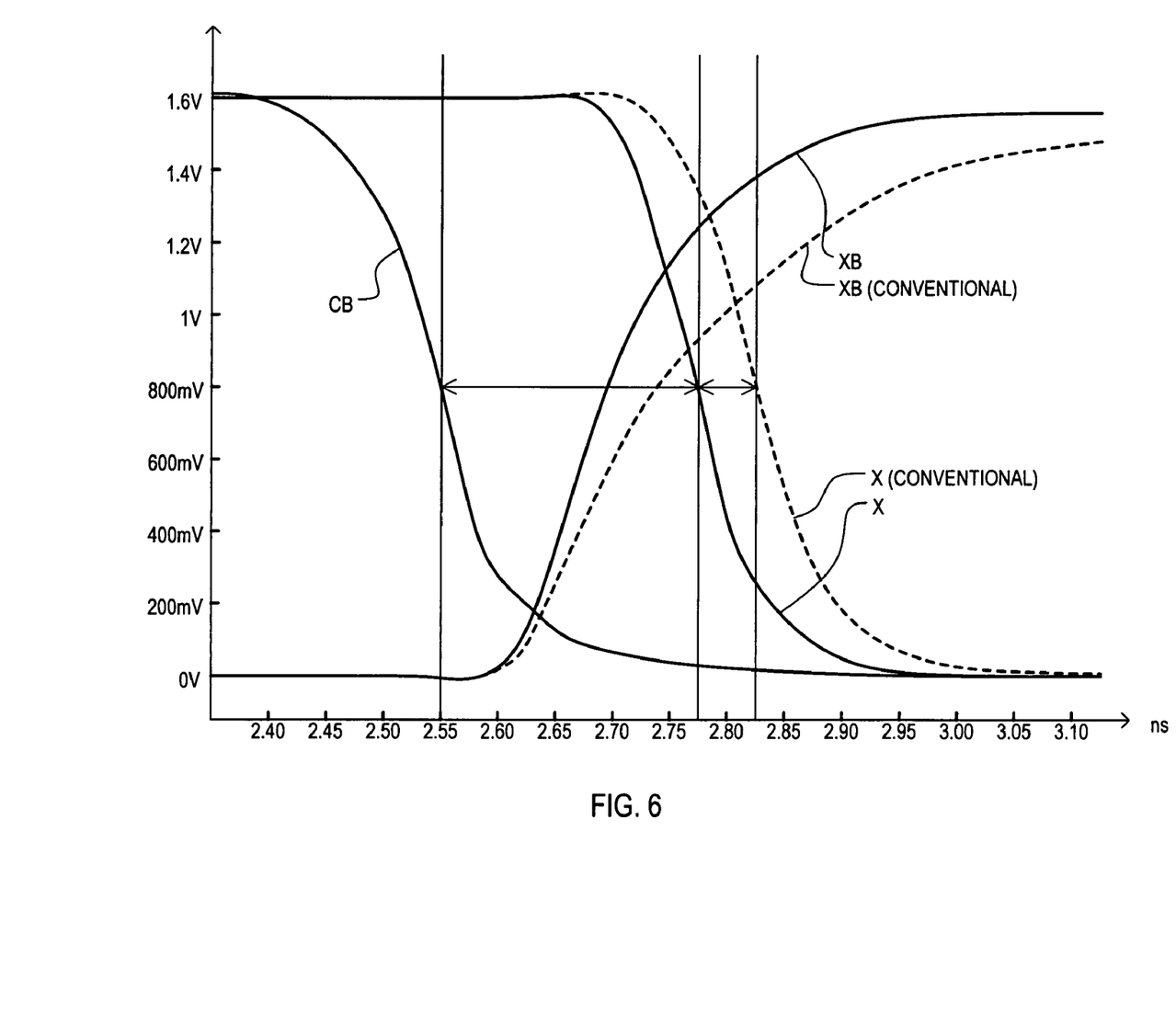
FIG. 6 is a timing diagram showing a simulation result of the embodiment shown in FIG. 2A compared to the prior art (conventional transmission gate).

To illustrate a speed advantage than can be achieved according to the embodiments of the present invention, a simulation result is set forth in FIG. 6. FIG. 6 is a timing diagram showing a comparison between the responses of the conventional circuit of FIG. 7A versus that of FIG. 2A. Conventional response for signals XB (output of passgate) and output signal X are shown as dashed waveforms. Responses of the embodiment of FIG. 2A for signals XB (output node 214) and output signal X are shown by solid waveforms.

As can be understood, in a worst case situation (transition from low-to-high of input signal CB, which can be the inverse of a primary signal C), the embodiment of FIG. 2A can provide about a 20% improvement in speed over the conventional approach.

The various embodiments of the present invention can enjoy wide application in various types of devices, but can be particularly applicable to those devices having a need for fast logic operations. One particular application can be as an address decoder circuit in a high speed memory, such as a quad data rate (QDR) random access memory (RAM) or other high speed RAM device.

Still further, alternative components for circuit elements could be substituted for those set forth in the various embodiments. As but one example, while threshold changes for inverters such as I208 and I402 were accomplished via sizing, alternatively doping may be used to alter such a threshold.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A transmission logic gate circuit, comprising:
 a passgate circuit having an input and an output;
 a supply path coupled between a supply node and the output of the passgate circuit comprising a boosting transistor and an enabling transistor having a gate that receives an enable control signal; and
 a boost path coupled between the input of the passgate and a gate of the boosting transistor that enables at least a portion of the supply path when a primary input signal at the input of the passgate circuit makes a predetermined transition.

2. The transmission logic gate circuit of claim 1, wherein;
 the passgate circuit comprises transistors of complementary conductivity having source drain paths arranged in parallel with one another.

3. The transmission logic gate circuit of claim 1 wherein:
 the supply path comprises a pull-up path coupled between a high supply voltage and the output of the passgate circuit.

4. The transmission logic gate circuit of claim 1, wherein:
 the supply path comprises a pull-down path coupled between a low supply voltage and the output of the passgate circuit.

5. The transmission logic gate circuit of claim 1, further including:
 a logic gate having at least two inputs different than the passgate input and a gate output that provides the enable control signal.

6. The transmission logic gate circuit of claim 1, wherein:
 the boost path comprises at least one inverter configured having a switching point different than a potential midway between a high logic level and a low logic level of the primary input signal.

7. The transmission logic gate circuit of claim 6, wherein:
 the switching point is selected from the group consisting of a potential less than the midway potential and a potential greater than the midway potential.

8. The transmission logic gate circuit of claim 6, wherein:
 the inverter comprises complementary conductivity transistors having a gate width ratio of greater than 7:1.

9. The transmission logic gate circuit of claim 1, further including:
 a logic gate having at least two inputs different than the passgate input, and a logic gate output coupled to the supply path and an enable input of the passgate.

10. The transmission logic gate circuit of claim 9, wherein:
 the logic gate is selected from the group consisting of NAND gates and NOR gates.

11. A method of reducing propagation delay through a transmission gate logic circuit, comprising:
 enabling a supply path coupled to an output of a passgate in advance of the activation of a primary signal at the input of the passgate; and
 boosting a signal strength at the output of the passgate by allowing charge to flow through the supply path.

12. The method of claim 11, wherein:
 enabling the supply path includes enabling a pull up path coupled between the output of the passgate and a high power supply voltage; and
 activation of the primary signal includes the primary signal transitioning from a low logic level to a high logic level while the passgate is enabled.

13. The method of claim 11, wherein:
 enabling the supply path includes enabling a pull-down path coupled between the output of the passgate and a low power supply voltage; and
 activation of the primary signal includes the primary signal transitioning from a high logic level to a low logic level while the passgate is enabled.

14. The method of claim 11, further including:
 enabling the passgate according to at least one input signal that is different than the primary input signal.

15. A transmission gate logic circuit, comprising:
a passgate coupled between a primary signal input and a passgate output that is enabled according to logic values of at least one input signal that is different than the primary signal;
a supply path coupled between the passgate output and a first predetermined potential;
a boost path coupled between the primary signal input and the supply path that enables at least a first portion of the supply path in response to a predetermined transition in the primary signal; and
a logic circuit having inputs that receive the at least one input signal and a logic circuit output, at least a second portion of the supply path and the passgate being enabled in response to the logic circuit output having a first value.

16. The transmission gate logic circuit of claim 15, wherein:
the passgate comprises at least one n-channel transistor;
the supply path includes at least one p-channel transistor having a source-drain path coupled between a high power supply voltage and the passgate output; and
the boost path includes an inverter including an n-channel transistor having a gate width greater than a p-channel transistor according to a ratio that is greater than 7:1.

17. The transmission gate logic circuit of claim 15, wherein:
the passgate comprises at least one p-channel transistor;
the supply path includes at least one n-channel transistor having a source-drain path coupled between a low power supply voltage and the passgate output; and
the boost path includes an inverter including a p-channel transistor having a gate width greater than an n-channel transistor according to a ratio that is greater than 7:1.

18. The transmission gate logic circuit of claim 15, further including:
a logic setting device coupled between the passgate output and a second predetermined potential that provides a current path when the logic circuit output has a second value.

19. The transmission gate logic circuit of claim 15, further including:
an enable path coupled between the logic circuit output and the supply path that enables at least a second portion of the supply path in response to a predetermined output of the logic circuit.

* * * * *